(12) United States Patent
Du

(10) Patent No.: US 12,100,742 B2
(45) Date of Patent: Sep. 24, 2024

(54) SEMICONDUCTOR DEVICE AND JUNCTION EDGE REGION THEREOF

(71) Applicant: NANJING SINNOPOWER TECHNOLOGY CO., LTD., Jiangsu (CN)

(72) Inventor: Wenfang Du, Jiangsu (CN)

(73) Assignee: Nanjing Sinnopower Technology Co., LTD, Jiangsu (CN)

( * ) Notice: Subject to any disclaimer, the term of this patent is extended or adjusted under 35 U.S.C. 154(b) by 311 days.

(21) Appl. No.: 17/632,286

(22) PCT Filed: Sep. 9, 2019

(86) PCT No.: PCT/CN2019/104866
§ 371 (c)(1),
(2) Date: Feb. 2, 2022

(87) PCT Pub. No.: WO2021/022614
PCT Pub. Date: Feb. 11, 2021

(65) Prior Publication Data
US 2022/0293746 A1    Sep. 15, 2022

(30) Foreign Application Priority Data
Aug. 7, 2019    (CN) .......................... 201910724064.9

(51) Int. Cl.
*H01L 29/40*    (2006.01)
*H01L 29/78*    (2006.01)

(52) U.S. Cl.
CPC .......... *H01L 29/404* (2013.01); *H01L 29/407* (2013.01); *H01L 29/7811* (2013.01)

(58) Field of Classification Search
CPC . H01L 29/404; H01L 29/407; H01L 29/7811; H01L 29/7395; H01L 29/0619;
(Continued)

(56) References Cited

U.S. PATENT DOCUMENTS 6,426,520 B1 * 7/2002 Traijkovic .......... H01L 29/0623
257/107
2010/0001344 A1 * 1/2010 Stefanov ............. H01L 29/7395
257/E21.135

(Continued)

FOREIGN PATENT DOCUMENTS

CN    105280723 A * 1/2016 ......... H01L 29/0619
CN    106024863 A   10/2016
(Continued)

*Primary Examiner* — Mohammad M Hoque
(74) *Attorney, Agent, or Firm* — Vincent J. Allen; Carstens, Allen & Gourley, LLP

(57) ABSTRACT

A semiconductor device and a junction edge region thereof. The junction edge region comprises a semiconductor substrate and an epitaxial layer above said substrate, the semiconductor substrate and the epitaxial layer being in a laminated structure and of the same conductor type; several floating regions spaced apart are provided between the semiconductor substrate and the epitaxial layer, a transition region is provided on the surface of the epitaxial layer adjacent to an active region portion, and the semiconductor substrate is additionally provided with a first semiconductor region.

16 Claims, 21 Drawing Sheets

(58) Field of Classification Search
CPC .............. H01L 29/0638; H01L 29/861; H01L 29/0623; H01L 29/1608; H01L 29/402; H01L 29/78
USPC ........................................................ 257/330
See application file for complete search history.

(56) References Cited

U.S. PATENT DOCUMENTS

| | | | |
|---|---|---|---|
| 2015/0084124 A1* | 3/2015 | Saito | .................. H01L 29/4236 257/330 |
| 2017/0345817 A1* | 11/2017 | Nishimura | ........ H01L 29/66348 |
| 2017/0365669 A1* | 12/2017 | Kim | .................... H01L 29/0623 |
| 2018/0240880 A1 | 8/2018 | Liu | |

FOREIGN PATENT DOCUMENTS

| | | | |
|---|---|---|---|
| CN | 108010958 A | 5/2018 | |
| CN | 108172609 A | 6/2018 | |
| CN | 108461541 A | 8/2018 | |
| JP | 2000101082 A | 4/2000 | |

* cited by examiner

SEMICONDUCTOR DEVICE AND JUNCTION EDGE REGION THEREOF

CROSS-REFERENCE TO RELATED APPLICATIONS

This application is a US 371 Application from PCT/CN2019/104866 filed Sep. 9, 2019, and published as WO 2021/022614 A1 on Feb. 11, 2021, which claims priority to Chinese Application No. 201910724064.9 filed Aug. 7, 2019. Each application, publication and patent listed in this paragraph is hereby incorporated herein by reference in its entirety, except for Chinese Application No. 201910724064.9.

BACKGROUND

Technical Field

The present invention relates to semiconductor devices, in particular to a semiconductor device for high voltage and/or power devices and a junction edge termination region thereof.

Related Art

The region between the active region (also referred to as the cell region) and the scribe line of a power semiconductor device is the junction edge termination region (also referred to as a terminal region) of the device. When the device is subjected to an applied voltage, the junction edge termination region will sustain all the applied voltage. Therefore, the voltage-sustaining performance of the junction edge termination region has an influence on the voltage-sustaining performance of the device. The structures of junction edge terminations are diversified, depending on the breakdown voltage levels of the devices. At present, commonly used junction edge terminations employ a field limiting ring (FLR) technique. The FLR refers to one or more rings doped in the same way around the PN-main-junction when the PN-main-junction is formed by diffusion, so that the applied voltage is distributed to the main junction and the PN junction formed by the ring(s) and the substrate, thus the electric field at the surface of the main junction is decreased and the breakdown voltage of the device is improved.

As the voltage withstanding level of the devices is increased, the design requirements for the size and doping of the FLRs become more and more stringent. There are various factors affecting the sustaining voltage of the junction edge termination region, mainly including the doping concentration of the substrate, the junction depth of the FLRs, the window size of the FLRs, the interval between the rings, and the surface charges, etc. Especially, a strong electric field existing on the surface severely limits the robustness and reliability of the devices; besides, surface charges may be introduced easily in the manufacturing process of the devices. The existence of the charges changes the electric field distribution at the junction edge, and consequently results in the change of the breakdown voltage, thus reliability and consistency of the devices is lowered.

SUMMARY OF ILLUSTRATIVE EMBODIMENTS OF THE INVENTION

In order to solve the above-mentioned technical problems, the object of the present application is to provide a semiconductor device and a junction edge termination region thereof, so as to reduce the influence of surface charges on breakdown voltage.

The object of the present application is attained and the technical problems of the present application are solved by using the following technical solution.

A junction edge termination region of a semiconductor device is proposed according to the present application, said junction edge termination region comprising: a semiconductor substrate of a first conductivity type; an epitaxial layer of the first conductivity type, adjacently arranged above the semiconductor substrate; a transition region of the second conductivity type, arranged in the surface of the epitaxial layer adjacent to an active region; a plurality of floating regions of the second conductivity type, arranged at intervals in the semiconductor substrate and the epitaxial layer; an insulator layer arranged on the surface of the epitaxial layer; and a first semiconductor region arranged at the bottom of the semiconductor substrate.

The present application further solves its technical problems with the following technical measures.

In an example of the present application, the thickness of the insulator layer is determined according to the design requirements, and the insulator layer partially covers the active region and the field stop region, or does not cover the active region and the field stop region at all.

In an example of the present application, the junction edge termination region further comprises a plurality of floating field limiting rings (FLRs) arranged on the surface of the epitaxial layer at intervals.

In an example of the present application, the insulator layer covers some of the plurality of floating FLRs.

In an example of the present application, the insulator layer covers all of the plurality of floating FLRs.

In an example of the present application, the positions of the plurality of floating regions correspond to the positions of the plurality of floating FLRs in the vertical direction.

In an example of the present application, the positions of the plurality of floating regions are staggered from the positions of the plurality of floating FLRs in the vertical direction.

In an example of the present application, with regard to the plurality of floating regions and the plurality of floating FLRs, they correspond to each other at some positions but staggered from each other at other positions in the vertical direction.

In an example of the present application, the number of the plurality of floating regions is equal to or different from the number of the plurality of floating FLRs.

In an example of the present application, the plurality of floating regions and the plurality of floating FLRs are all connected or partially connected.

In an example of the present application, the insulator layer can selectively employ insulating materials including silicon dioxide, benzocyclobutene (BCB), polyimide (PI), or composite layers of silicon dioxide and other substances, such as composite layers of silicon dioxide and silicon nitride, composite layers of silicon dioxide and polyimide (PI), etc.

In an example of the present application, the plurality of floating FLRs are spaced at equal or unequal intervals.

In an example of the present application, the widths of the plurality of floating FLRs are equal to or different from each other.

In an example of the present application, field plates are arranged above some or all of the plurality of floating FLRs, and are isolated from the corresponding floating FLRs by the insulator layer.

In an example of the present application, field plates are arranged above some or all of the plurality of floating FLRs, and penetrate through the insulator layer to contact with the floating FLRs at corresponding positions.

In an example of the present application, the material of the field plates is a conductive medium, including polycrystalline silicon or a metal material with electric conductivity.

In an example of the present application, the epitaxial layer has a hierarchical structure of multiple epitaxies.

In an example of the present application, some or all levels of the epitaxial layer are provided with the plurality of floating regions.

In an example of the present application, the junction edge termination region further comprises a field stop ring of the first conductivity type arranged in the surface of the epitaxial layer, said field stop ring being arranged apart from the transition region.

In an example of the present application, the plurality of floating regions are spaced at equal or unequal intervals.

In an example of the present application, the widths of the plurality of floating regions are equal to or different from each other.

In an example of the present application, the semiconductor region is of the first conductivity type or the second conductivity type.

In an example of the present application, the junction edge termination region further comprises a second semiconductor region, the conductivity type of which is different from that of the first semiconductor region, the second semiconductor region being arranged adjacent to the first semiconductor region in stacked layers, or arranged adjacent to the first semiconductor region on the same layer.

In an example of the present application, the junction edge termination region further comprises a second semiconductor region and a third semiconductor region, the conductivity type of the second semiconductor region is different from that of the first semiconductor region and the conductivity type of the third semiconductor region is the same as that of the first semiconductor region, the second semiconductor region and the third semiconductor region are adjacently arranged on the same layer, and they are arranged adjacent to and below the first semiconductor region in stacked layers.

In an example of the present application, the concentration of the semiconductor substrate is equal to or different from that of the epitaxial layer.

In an example of the present application, the materials of the aforementioned semiconductors include silicon (Si) or silicon carbide (SiC) material.

In an example of the present application, the first conductivity type is N-type, and the second conductivity type is P-type.

In an example of the present application, the first conductivity type is P-type, and the second conductivity type is N-type.

Another object of the present application is to propose a semiconductor device, which comprises an active region and a junction edge termination region, wherein the junction edge termination region comprises: an N-type semiconductor substrate; an N-type epitaxial layer arranged above the N-type semiconductor substrate, which is a homoepitaxial layer made of the same material as the material of the N-type semiconductor substrate or a heteroepitaxial layer made of a material different from the material of the N-type semiconductor substrate; a P-type transition region arranged in a location on the surface of the N-type epitaxial layer adjacent to an active region; an N-type field stop ring arranged on the N-type epitaxial layer and located on the surface of the N-type epitaxial layer, and separated from the P-type transition region; a plurality of P-type floating regions arranged in locations on the bottom of the N-type semiconductor substrate adjacent to the N-type epitaxial layer at interval; an insulator layer arranged on the surface of the N-type epitaxial layer; and an N-type semiconductor region arranged at the bottom of the N-type semiconductor substrate.

In the present application, floating regions are buried in the semiconductor device, and when the semiconductor device is subjected to reverse voltage drop, the deeply buried floating regions absorb a part of the electric flux lines emitted from the positively charged ionization donors in the semiconductor substrate, thereby decrease the electric field peak at the main junction in the transition region, thus disperse the applied voltage to decrease the electric field concentration. At the same time, since the electric field peak is located inside the semiconductor device and there is no high electric field on the surface, the change of breakdown voltage caused by the change of electric field distribution at the junction edge by surface charges is avoided, and decrease of lifetime of the device caused by excitation of the hot carriers to the oxidation layer is also avoided, thereby the reliability and consistency of the device are improved.

DETAILED DESCRIPTION

Figure 1:
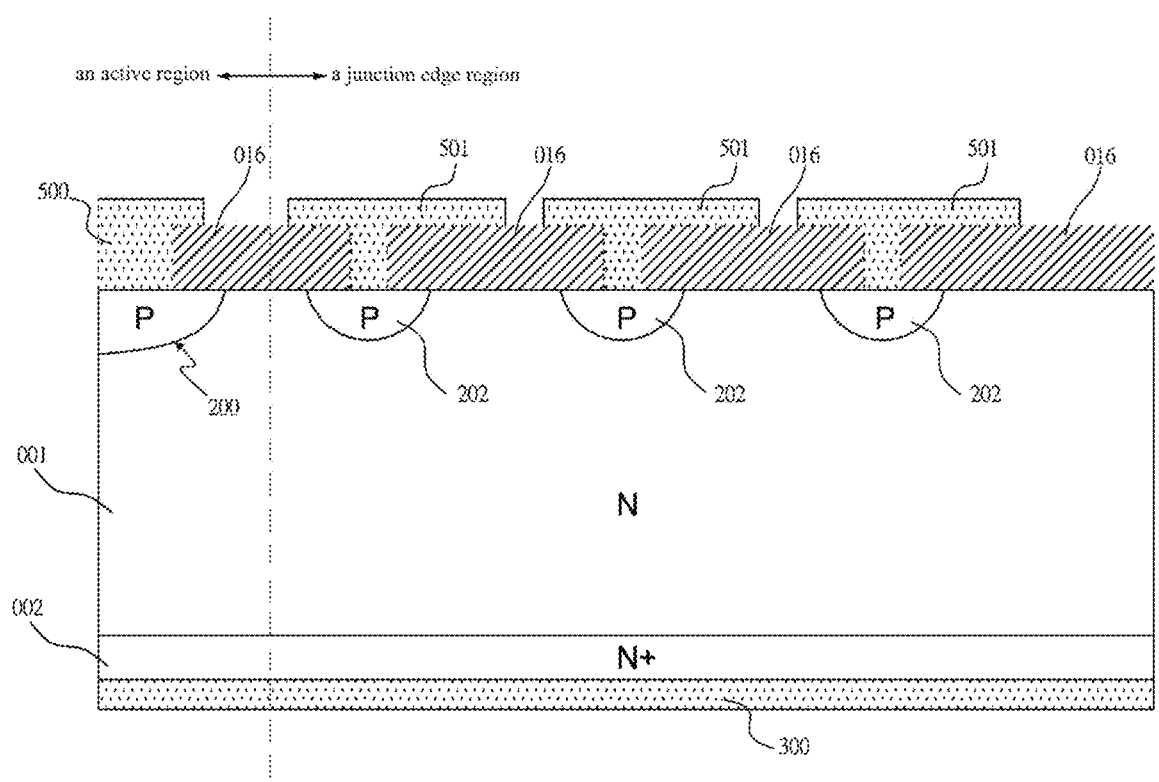
FIG. 1 is a schematic structural diagram of an exemplary semiconductor device.

Here reference is made to the drawings, in which the same reference numbers represent the same components. The following description is based on the illustrated specific examples of the present application, but should not be regarded as limitation to other examples of the present application that are not detailed herein.

The following examples are described with reference to the accompanying drawings to illustrate specific examples that can be implemented according to the present application. The directional terms mentioned in the present application, such as [top], [bottom], [front], [back], [left], [right], [inside], [outside], [side], etc., only refer to the directions in the accompanying drawings. Therefore, the directional terms are used to illustrate and explain the present application but are not intended to limit the present application.

The terms "first", "second", "third" and so on (if any) in the Description, Claims, and above-mentioned accompanying drawings of the present application are intended to differentiate similar objects, and may not be necessarily used to describe a specific order or sequential order. It should be understood that the objects thus described can be interchanged under appropriate circumstances. In addition, the terms "comprise", "include" and "have" and their variants are intended to cover non-exclusive inclusion.

The terms used in this specification are only used to describe specific examples, but are not intended to reveal the concept of the present application. Unless otherwise specified explicitly in the context, expressions used in singular forms encompass expressions in plural forms. In this specification, it should be understood that terms, such as "comprise", "have" and "contain", etc., are intended to indicate the possibility of the existence of the features, numbers, steps, actions or combinations thereof disclosed in this specification, but are not intended to exclude the possibility of existence or addition of one or more other features, numbers, steps, actions or combinations thereof. The same reference numbers in the accompanying drawings refer to the same parts.

The accompanying drawings and description thereof should be regarded as exemplary in nature, rather than limiting. In the drawings, units with similar structures are represented by the same reference numbers. In addition, for the purpose of facilitating comprehension and description, the size and thickness of each component shown in the accompanying drawings are shown arbitrarily, but the present application is not limited thereto.

In the accompanying drawings, the configuration ranges of apparatuses, systems, components and circuits are exaggerated for the purpose of clarification, understanding and description. It should be understood that when a component is described to be "on" another component, the component may be directly on another component, or an intermediate component may exist therebetween.

In addition, in the specification, unless otherwise described explicitly in the context, the term "comprise" or "include" should be understood as including the described components, but not excluding any other components. In addition, in the specification, the word "on . . . " means above or below the target component, and does not necessarily mean on the top based on the gravity direction.

In order to further explain the technical means employed by the present invention to achieve the intended object and their efficacies, hereunder the semiconductor device and the junction edge termination region thereof proposed according to the present invention, their specific embodiments, structures, features and efficacies will be detailed in the following with reference to the drawings and specific examples.

FIG. 1 is a schematic structural diagram of an exemplary semiconductor device. The semiconductor device comprises a semiconductor substrate 001 of the first conductivity type (N-type), a doped region 002 is arranged in the bottom surface of the semiconductor substrate 001 and in contact with a second metal layer 300 that serves as a first electrode. The semiconductor device comprises an active region (the structure is only for illustration but not limiting, and may be a diode, MOSFET, IGBT or thyristor) and a junction edge termination region on the periphery of the active region. The active region comprises a semiconductor substrate 001 and a metal contact region 200 of the second conductivity type (P-type), the metal contact region 200 is in contact with a metal layer 500 that serves as a second electrode, or is grounded, and the semiconductor substrate 001 and the metal contact region 200 are used to form a PN-main-junction. The structure of the junction edge termination region employs a field limiting ring (FLR) technique. Although the first conductivity type is N-type and the second conductivity type is P-type here, it is also applicable that the first conductivity type is P-type and the second conductivity type is N-type.

As shown in FIG. 1, there are one or more FLRs 202 doped in the same way around the PN-main-junction when the PN-main-junction is formed by diffusion, so that the reverse bias voltage is distributed to the PN-main-junction and the PN junction formed by the FLRs 202 and the semiconductor substrate 001, thereby the intense electric field at the surface of the PN-main-junction is decreased and the sustaining voltage of the semiconductor device is improved. However, surface charges may be introduced very easily in the manufacturing process of the semiconductor device. The existence of the charges changes the electric field distribution at the junction edge termination, which means that the surface electric field of the semiconductor device is high, and is sensitive to surface charges, consequently leading to decreased breakdown voltage. In addition, the high surface electric field may easily inject hot carriers into the oxidation layer on the device surface, resulting in shortened lifetime of the semiconductor device and compromised reliability and consistency of the semiconductor device.

Although the influence of the surface charges can be reduced by arranging metal (or polycrystalline silicon) field plates (the structure of which is identical or similar to that of the first metal layer 501 described later) at the junction edge termination region, when the device is sustained the applied voltage, only the PN junction formed by the FLRs 202 and the semiconductor substrate 001 in the junction edge termination region can withstand the applied voltage and peak electric field still exists on the surface of the PN junction. Therefore, the aforementioned problem still exists.

For the following examples, please refer to FIG. 1 to facilitate understanding of the exemplary semiconductor device structure. Besides, for the convenience of explanation, hereunder it is described on the premise that the first conductivity type is N-type and the second conductivity type is P-type temporarily.

Figure 2:
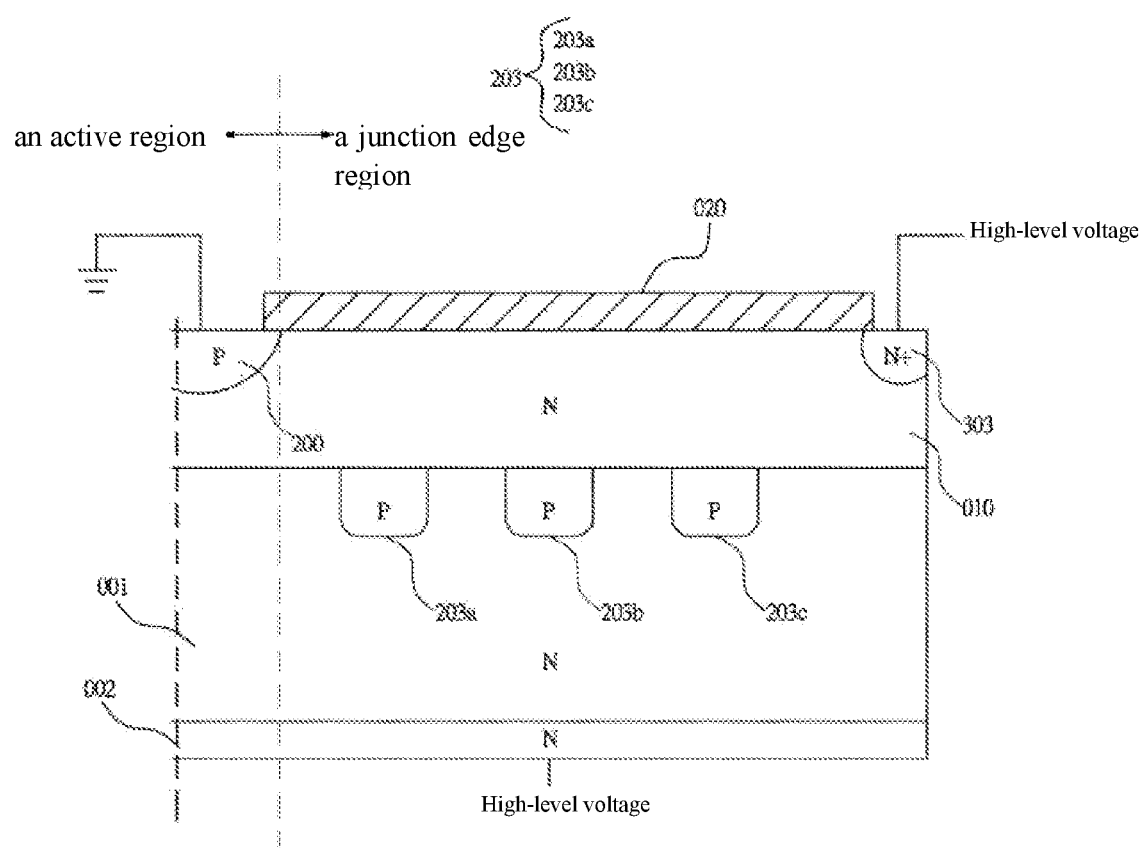
FIG. 2 is a schematic structural diagram of the junction edge termination region of a semiconductor device according to an example of the present application.
Figure 3:
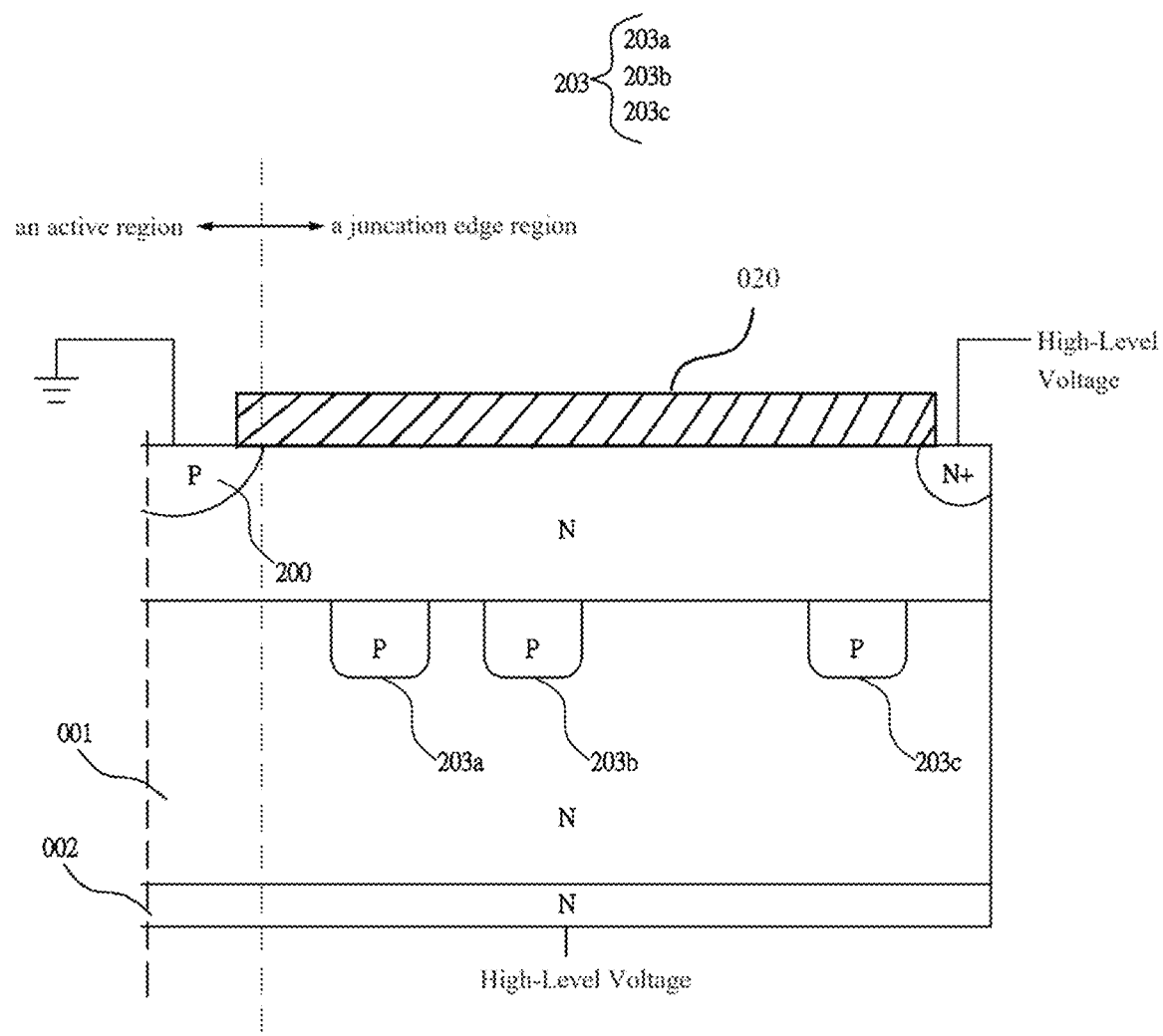
FIG. 3 is a schematic structural diagram of the junction edge termination region of a semiconductor device according to an example of the present application.
Figure 4:
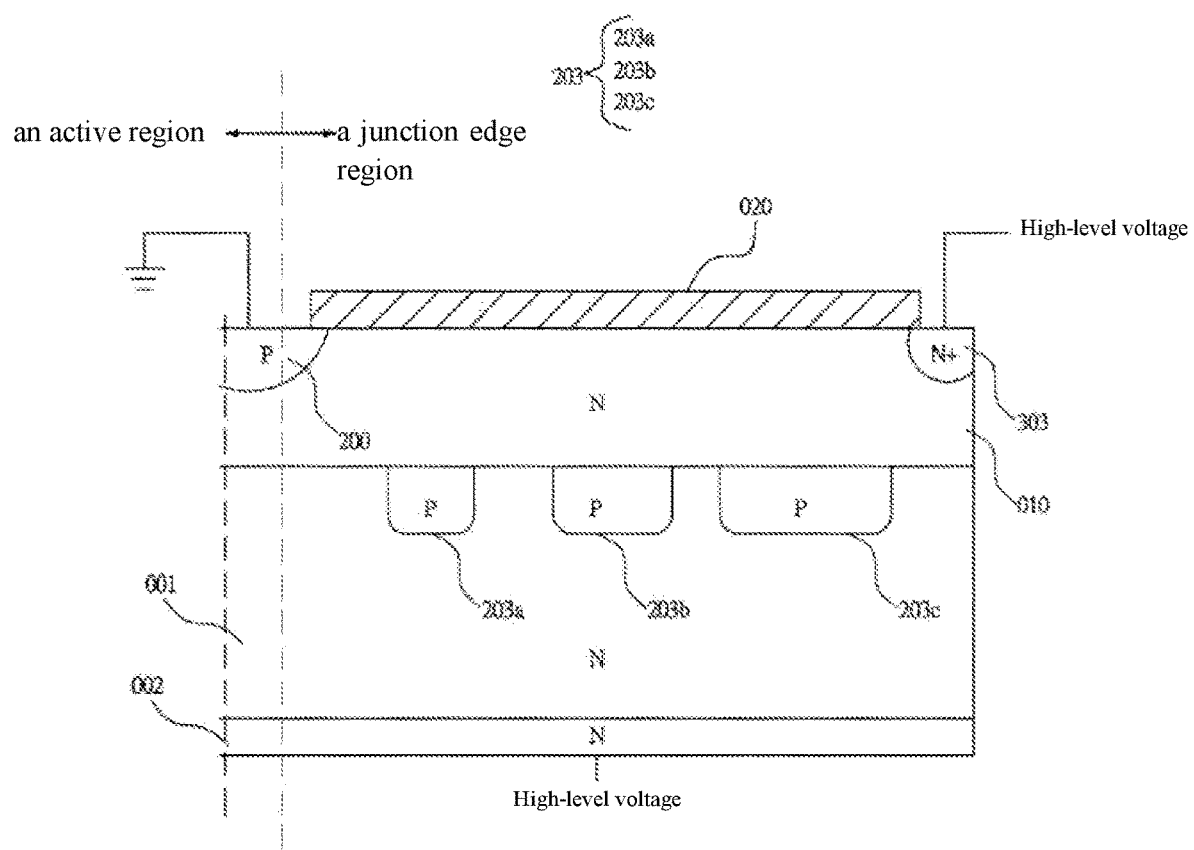
FIG. 4 is a schematic structural diagram of the junction edge termination region of a semiconductor device according to an example of the present application.

FIGS. 2-4 are schematic structural diagrams of the junction edge termination region of a semiconductor device according to an example of the present application. As shown in FIG. 2, in an example of the present application, the junction edge termination region comprises: a semiconductor substrate 001 of the first conductivity type; an epitaxial layer 010 of the first conductivity type adjacently grown on the semiconductor substrate 001; a transition region 200 of the second conductivity type (equivalent to the aforementioned metal contact region) arranged in a location in the surface of the epitaxial layer 010 adjacent to the active region; a plurality of floating regions 203 of the second conductivity type arranged in the semiconductor substrate 001 and the epitaxial layer 010 at interval; an insulator layer 020 arranged on the surface of the epitaxial layer 010; and a first semiconductor region 002 arranged in the bottom surface of the semiconductor substrate 001.

In an example of the present application, the methods for forming the floating regions 203 include, but are not limited to: (1) forming a semiconductor substrate 001, forming floating regions 203 in the upper surface of the semiconductor substrate 001 by ion implantation and diffusion, and then forming an epitaxial layer 010 on the surface of the semiconductor substrate 001, so that the floating regions 203 are buried inside the junction edge termination of the semiconductor device; (2) forming a semiconductor substrate 001, forming an epitaxial layer 010 on the surface of the semiconductor substrate 001, and then forming floating regions 203 in the surface of the epitaxial layer 010 by ion implantation from the upper surface of the epitaxial layer 010, so that the floating regions 203 are buried inside the junction edge termination of the semiconductor device.

In an example of the present application, the epitaxial layer 010 is a homoepitaxial layer, the material of which is the same as the material of the semiconductor substrate 001, or is a heteroepitaxial layer, the material of which is different from the material of the semiconductor substrate 001.

In an example of the present application, the first semiconductor region 002 is of the first conductivity type or the second conductivity type.

In an example of the present application, the concentration of the semiconductor substrate 001 is equal to or different from that of the epitaxial layer 010.

In an example of the present application, the junction edge termination region further comprises a field-stop ring 303 of the first conductivity type, which is arranged on the epitaxial layer 010 and located in the upper surface of the epitaxial layer 010, and is separated from the transition region 200.

In an example of the present application, when the first semiconductor region 002 and the field stop ring 303 are at a high potential while the transition region 200 is at a low potential or grounded, i.e., when the semiconductor device sustains reverse voltage drop, the PN junction formed by the transition region 200, the epitaxial layer 010 and the semiconductor substrate 001 serves as the main junction region, and the epitaxial layer 010 begins to be depleted. As the reverse voltage drop increases, the semiconductor substrate 001 begins to be partially depleted. A depletion region in the semiconductor substrate 001 will sequentially reach the first floating region 203a, the second floating region 203b and the third floating region 203c from left to right, and so on. At that point, each floating region 203 will also be partially depleted, and the partially depleted floating regions 203 and the partially depleted semiconductor substrate 001 will bear a part of the reverse voltage drop, i.e., they share the reverse voltage drop borne by the PN-main-junction.

In an example of the present application, the PN junction formed by each floating region 203 and the semiconductor substrate 001 is located inside the semiconductor device, i.e., far away from the upper surface of the semiconductor device, so the electric field peak is located inside the semiconductor device. Thus the existence of a strong electric field on the upper surface of the semiconductor device is avoided. It means that the device is no longer sensitive to surface charges; at the same time, hot carriers will not be injected into the surface oxidation layer, thereby the influence of surface charges on sustaining voltage is improved, and the reliability and consistency of the device are improved.

In an example of the present application, the thickness of the insulator layer 020 is determined according to the design requirements, and the insulator layer covers the active region and the field stop region 303 partially, or does not cover the active region and the field stop region 303 at all. As shown in FIG. 2, in an example of the present application, the floating regions 203 are spaced at equal interval. As shown in FIG. 3, in some examples, the floating regions 203 are spaced at unequal intervals.

As shown in FIG. 2, in an example of the present application, the widths of the floating regions 203 are equal to each other. As shown in FIG. 4, in some examples, the widths of the floating regions 203 are different from each other.

The number, intervals, widths and coverage of the floating regions 203 may be determined according to the requirements of the designer for the functionality of the device, and are not limited to these examples.

FIGS. 5-13 are schematic structural diagrams of the junction edge termination region including FLRs of a semiconductor device according to an example of the present application. In an example of the present application, the junction edge termination region further comprises a plurality of floating field limiting rings (FLRs) 202 arranged in the surface of the epitaxial layer 010 at intervals.

In an example of the present application, when the first semiconductor region 002 is at a high potential while the transition region 200 is at a low potential or grounded, i.e., when the semiconductor device is applied with reverse voltage drop, the PN junction formed by the transition region 200, the epitaxial layer 010 and the semiconductor substrate 001 serves as the main junction region, and the epitaxial layer 010 begins to be depleted. As the reverse voltage drop increases, the semiconductor substrate 001 begins to be partially depleted. The depleted region of the epitaxial layer 010 will sequentially reach the first floating FLR 202a, the second floating FLR 202b and the third floating FLR 202c from left to right, and the depleted region in the semiconductor substrate 001 will sequentially reach the first floating region 203a, the second floating region 203b and the third floating region 203c from left to right, and so on. At that point, each floating region 203 and each floating FLR 202 will also be partially depleted, and the PN junction generated by the partially depleted floating region 203 and partially depleted semiconductor substrate 001, and the PN junction generated by partially depleted floating FLR 202 and partially depleted epitaxial layer will share the reverse voltage drop borne by the PN-main-junction.

Figure 5:
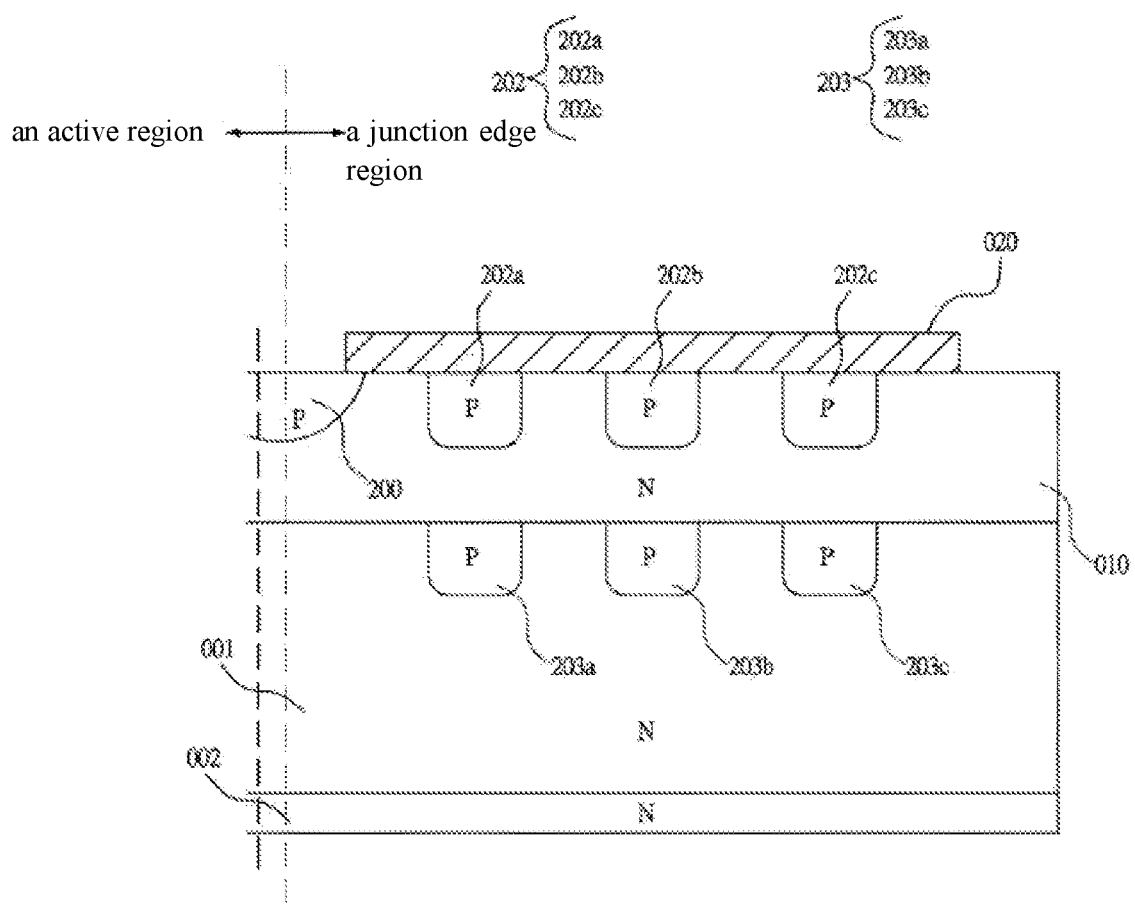
FIG. 5 is a schematic structural diagram of the junction edge termination region including FLRs of a semiconductor device according to an example of the present application.
Figure 6:
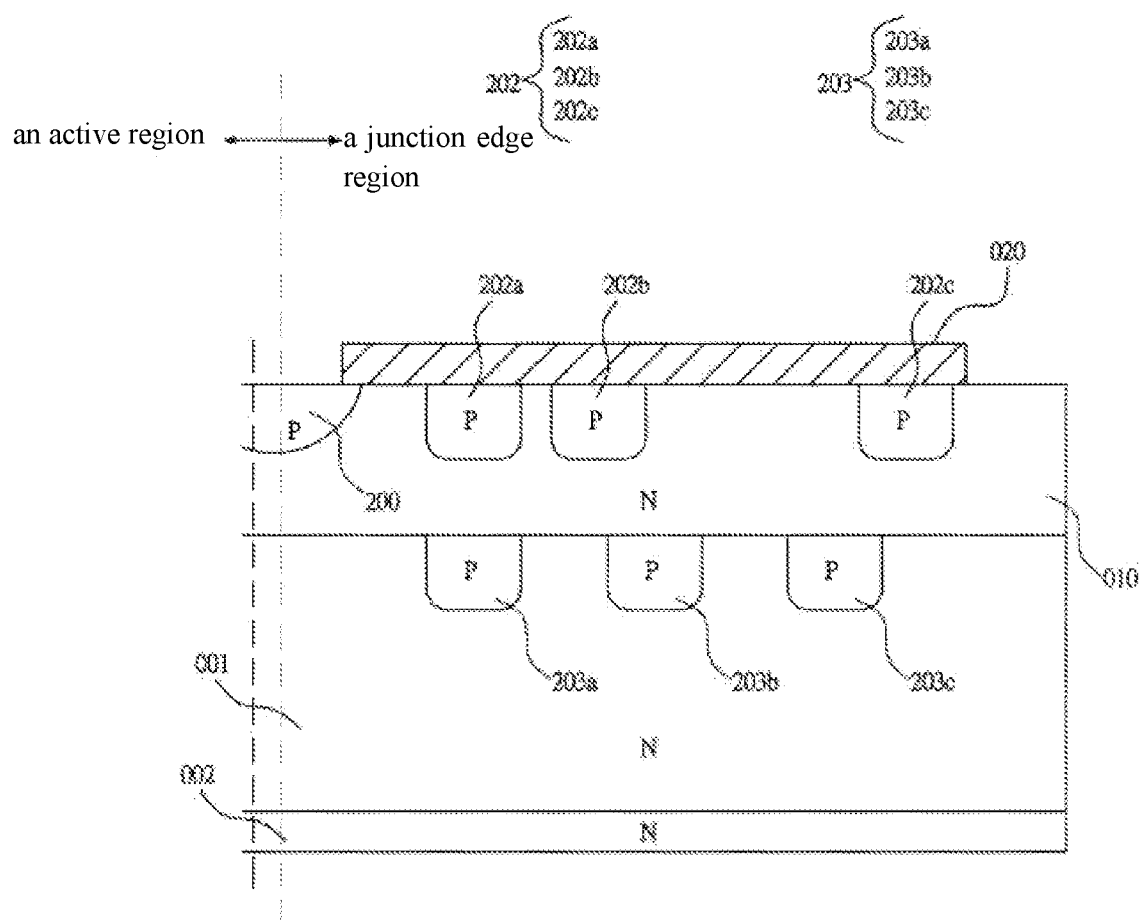
FIG. 6 is a schematic structural diagram of the junction edge termination region including FLRs of a semiconductor device according to an example of the present application.

As shown in FIG. 5, in an example of the present application, the floating FLRs 202 are spaced at equal interval. As shown in FIG. 6, in some examples, the floating FLRs 202 are spaced at unequal intervals.

Figure 7:
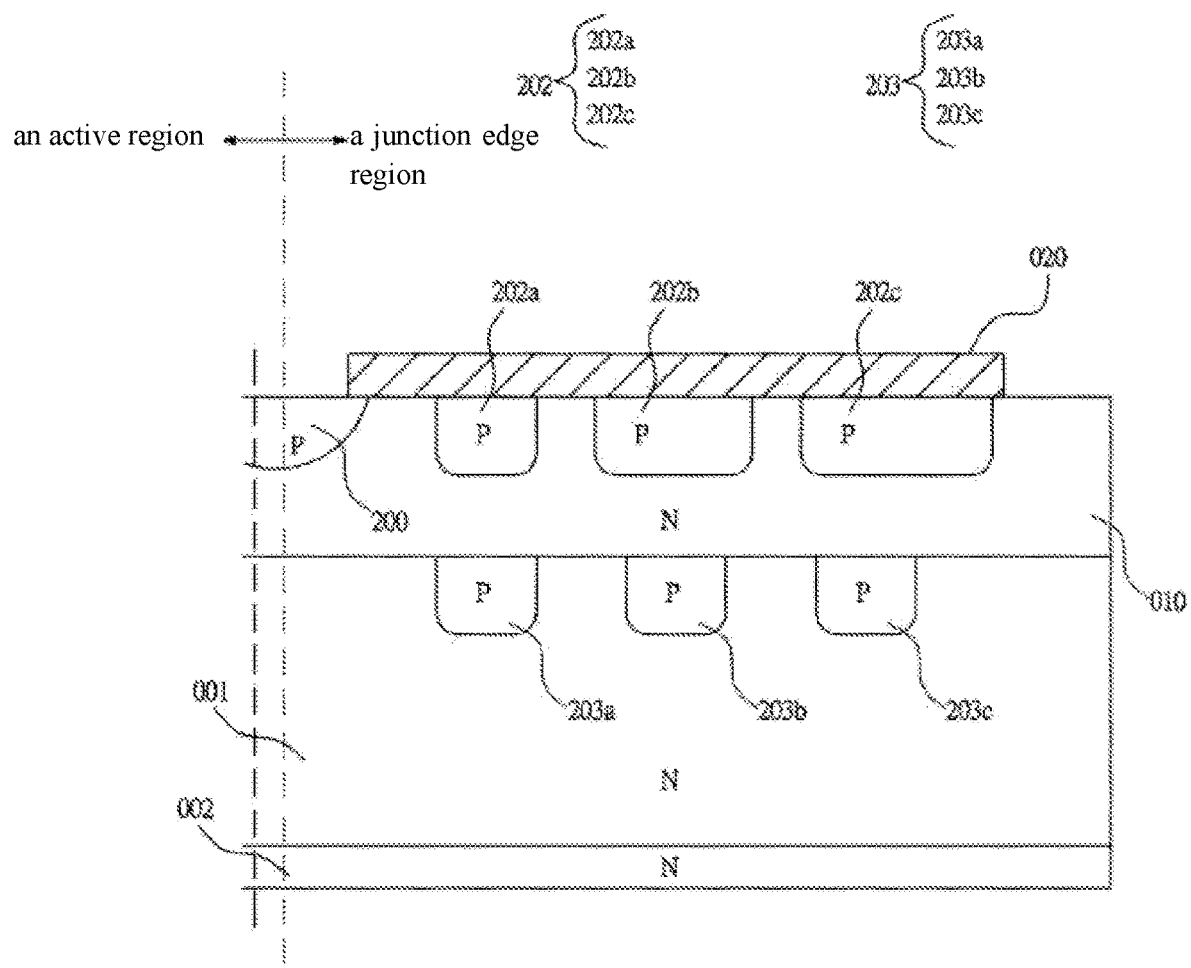
FIG. 7 is a schematic structural diagram of the junction edge termination region including FLRs of a semiconductor device according to an example of the present application.

As shown in FIG. 5, in an example of the present application, the widths of the floating FLRs 202 are equal to each other. As shown in FIG. 7, in some examples, the widths of the floating FLRs 202 are different from each other.

In an example of the present application, the insulator layer 020 can selectively employ insulating materials including silicon dioxide or benzocyclobutene (BCB) or polyimide (PI), or composite layers of silicon dioxide and other substances, such as composite layers of silicon dioxide and silicon nitride, composite layers of silicon dioxide and polyimide (PI), etc.

As shown in FIG. 5, the insulator layer 020 covers all of the floating FLRs 202. In some examples, the insulator layer 020 covers some of the floating FLRs 202.

Figure 8:
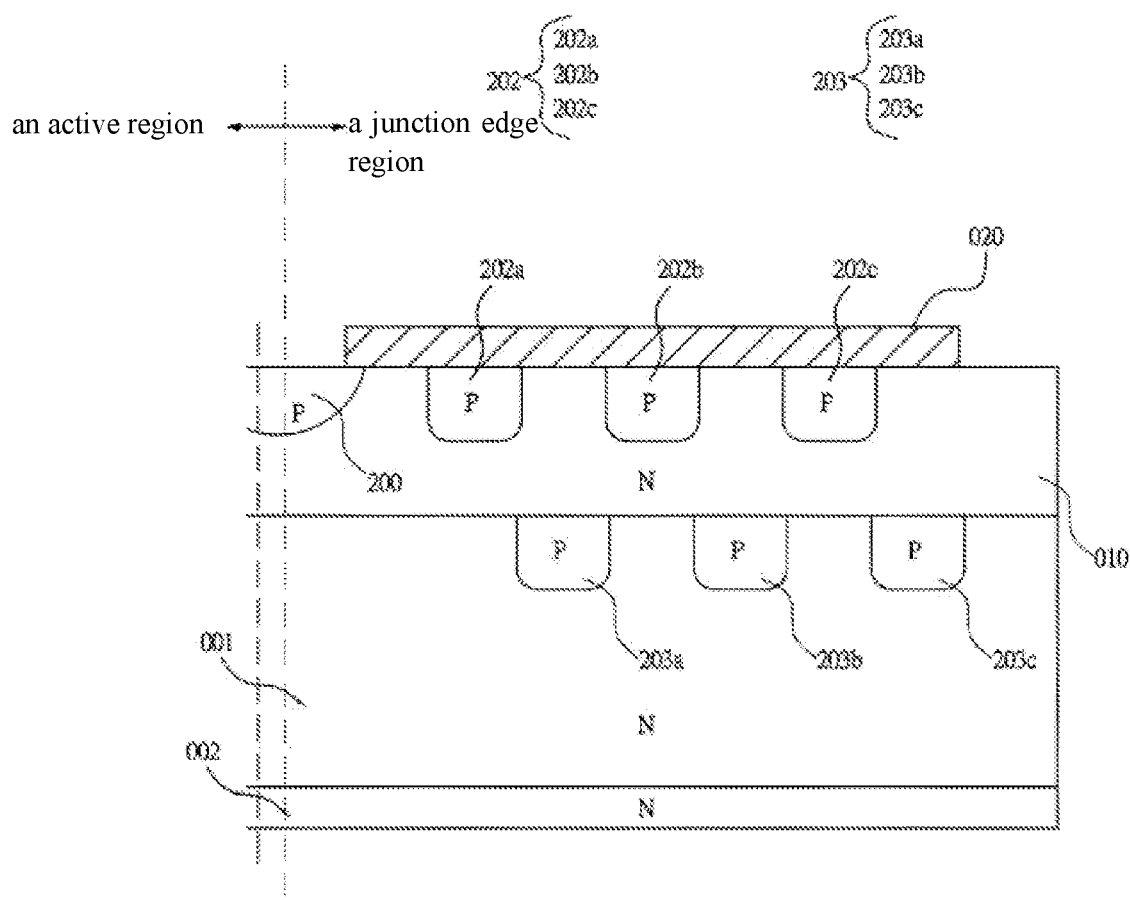
FIG. 8 is a schematic structural diagram of the junction edge termination region including FLRs of a semiconductor device according to an example of the present application.
Figure 9:
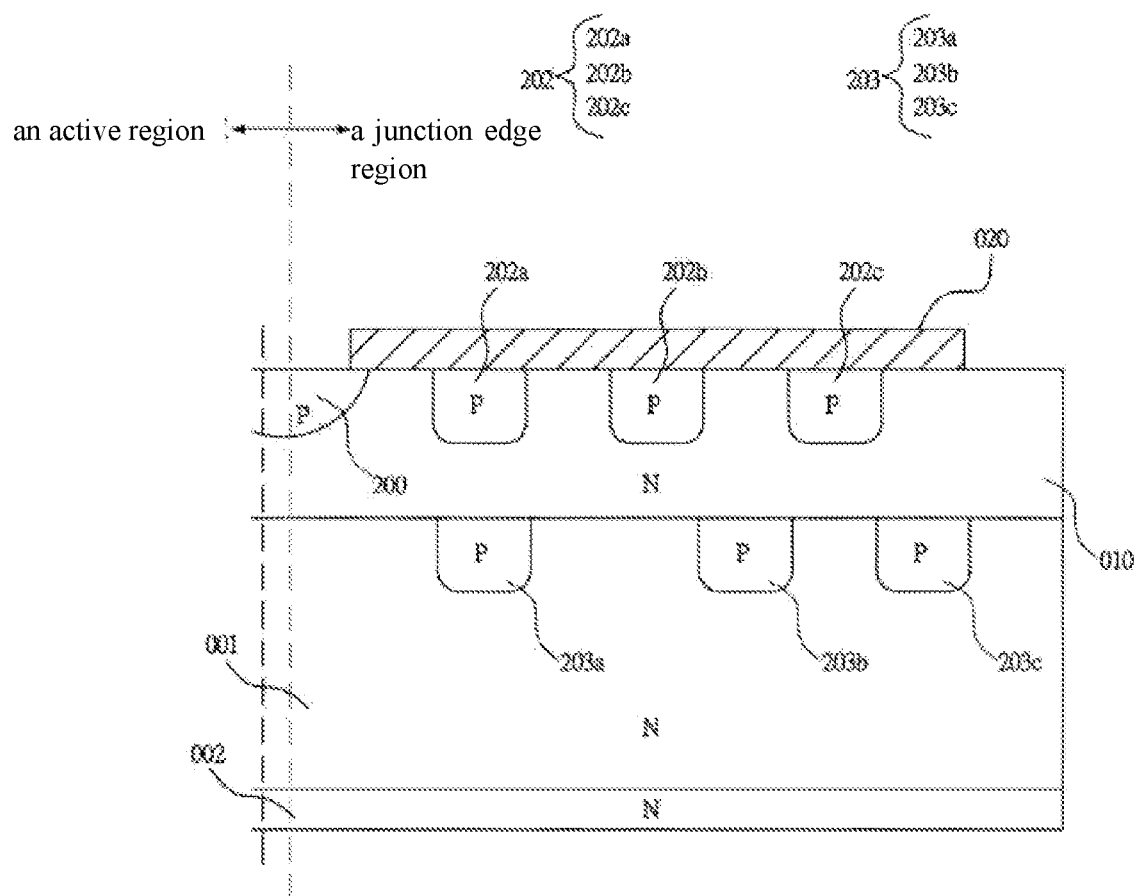
FIG. 9 is a schematic structural diagram of the junction edge termination region including FLRs of a semiconductor device according to an example of the present application.

As shown in FIG. 5, in an example of the present application, the positions of the floating regions 203 correspond to the positions of the floating FLRs 202 in the vertical direction. As shown in FIG. 8, in some examples, the positions of the floating regions 203 are staggered from the positions of the floating FLRs 202 in the vertical direction. As shown in FIG. 9, in some examples, the floating regions and the floating FLRs correspond to each other at some positions and staggered from each other at some positions in the vertical direction.

Figure 10:
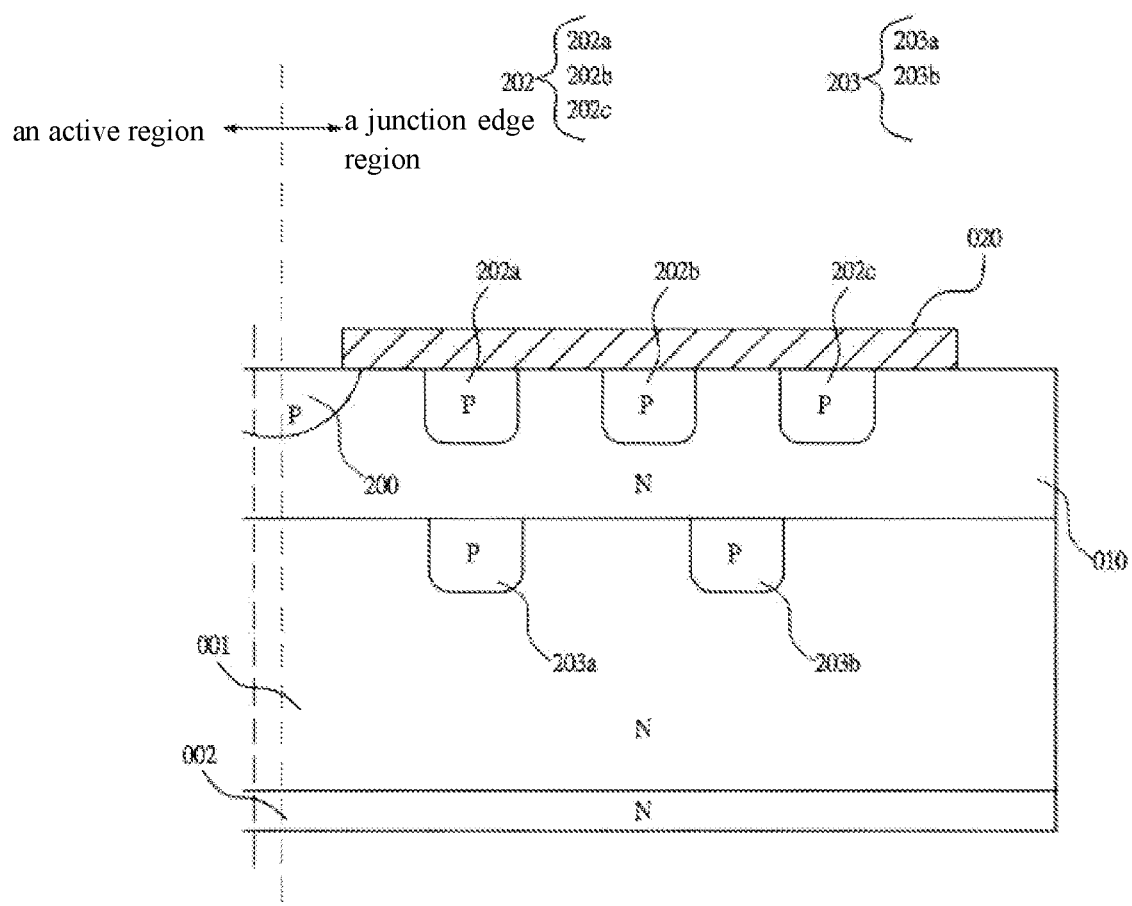
FIG. 10 is a schematic structural diagram of the junction edge termination region including FLRs of a semiconductor device according to an example of the present application.

As shown in FIG. 5, in an example of the present application, the number of the floating regions 203 is equal to the number of the floating FLRs 202. As shown in FIG. 10, in some examples, the number of the floating regions 203 is different from the number of the floating FLRs 202.

Figure 11:
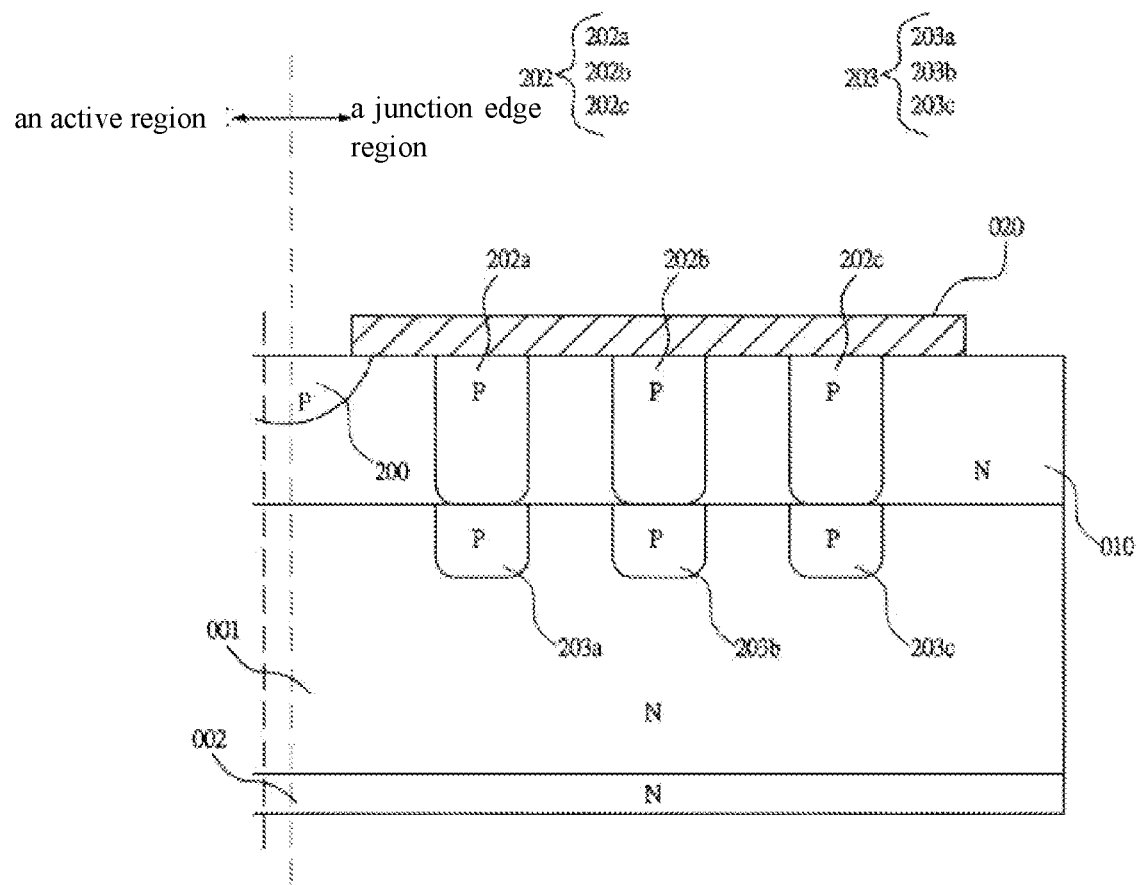
FIG. 11 is a schematic structural diagram of the junction edge termination region including FLRs of a semiconductor device according to an example of the present application.
Figure 12:
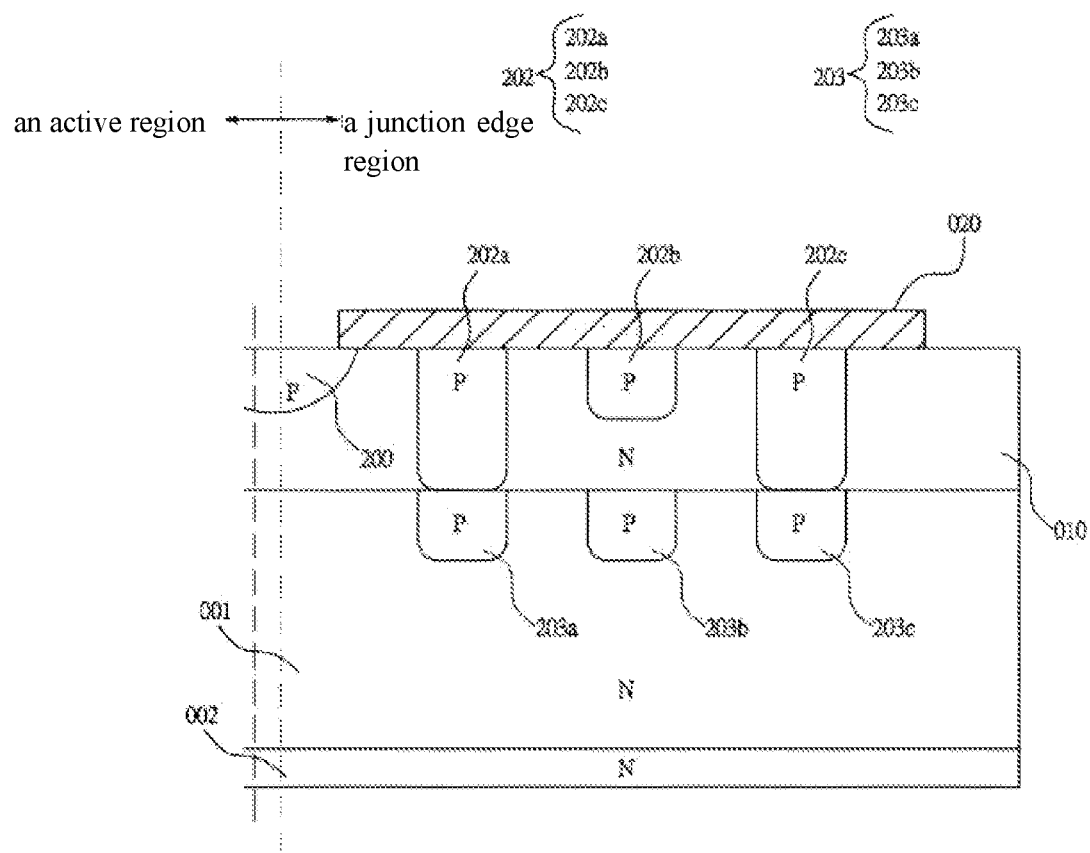
FIG. 12 is a schematic structural diagram of the junction edge termination region including FLRs of a semiconductor device according to an example of the present application.

As shown in FIG. 5, in an example of the present application, the floating regions 203 and the floating FLRs 202 are not connected with each other at all. As shown in FIG. 11, in an example of the present application, the floating regions 203 and the floating FLRs 202 are all connected with each other. As shown in FIG. 12, in some examples, the floating regions 203 are partially connected with the floating FLRs 202.

That is to say, the arrangement positions, configurable numbers and connection of the floating regions 203 and the floating FLRs 202 are determined according to the functional design of the semiconductor device made by the designer, and are not limited to those examples.

Figure 13:
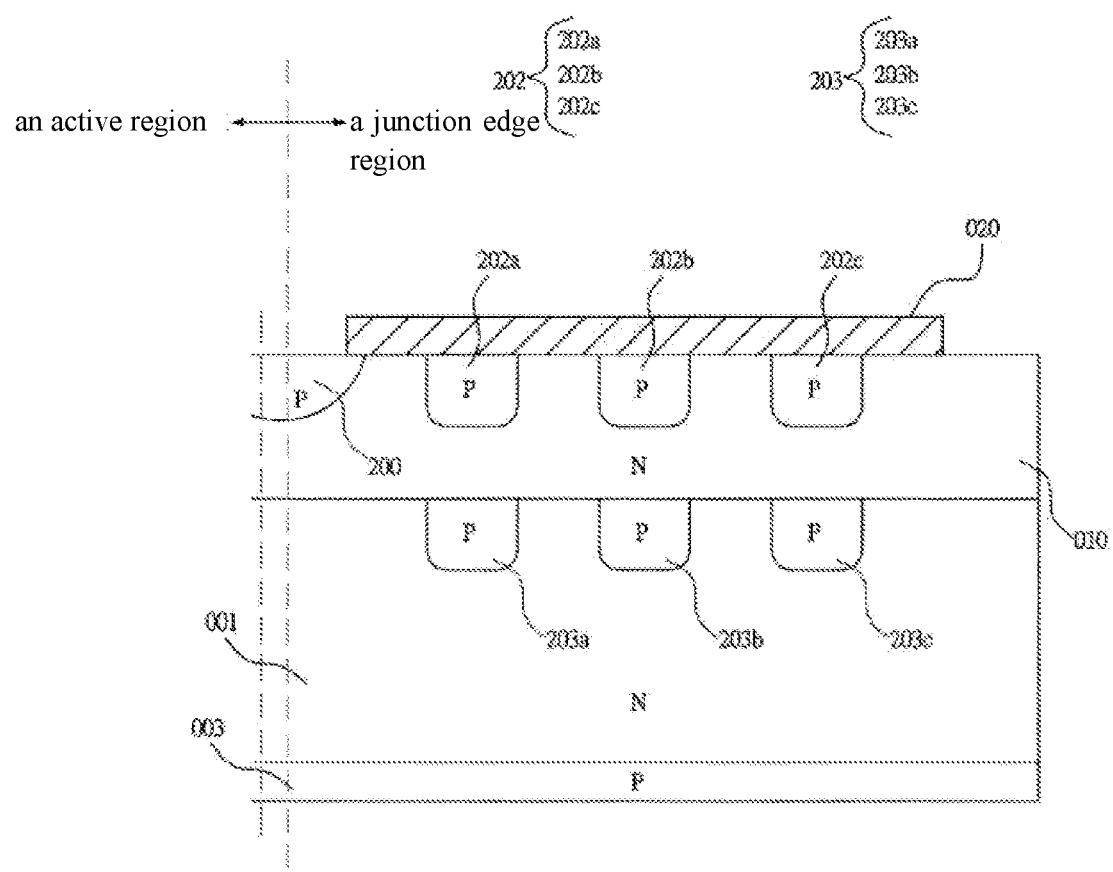
FIG. 13 is a schematic structural diagram of the junction edge termination region of a semiconductor device according to an example of the present application.

As shown in FIG. 5, the first semiconductor region 002 is of N-type. FIG. 13 is a schematic structural diagram of the junction edge termination region of a semiconductor device according to an example of the present application. In some examples, the bottom surface region of the semiconductor substrate 001 is replaced by a P-type second semiconductor region 003 instead.

Figure 14:
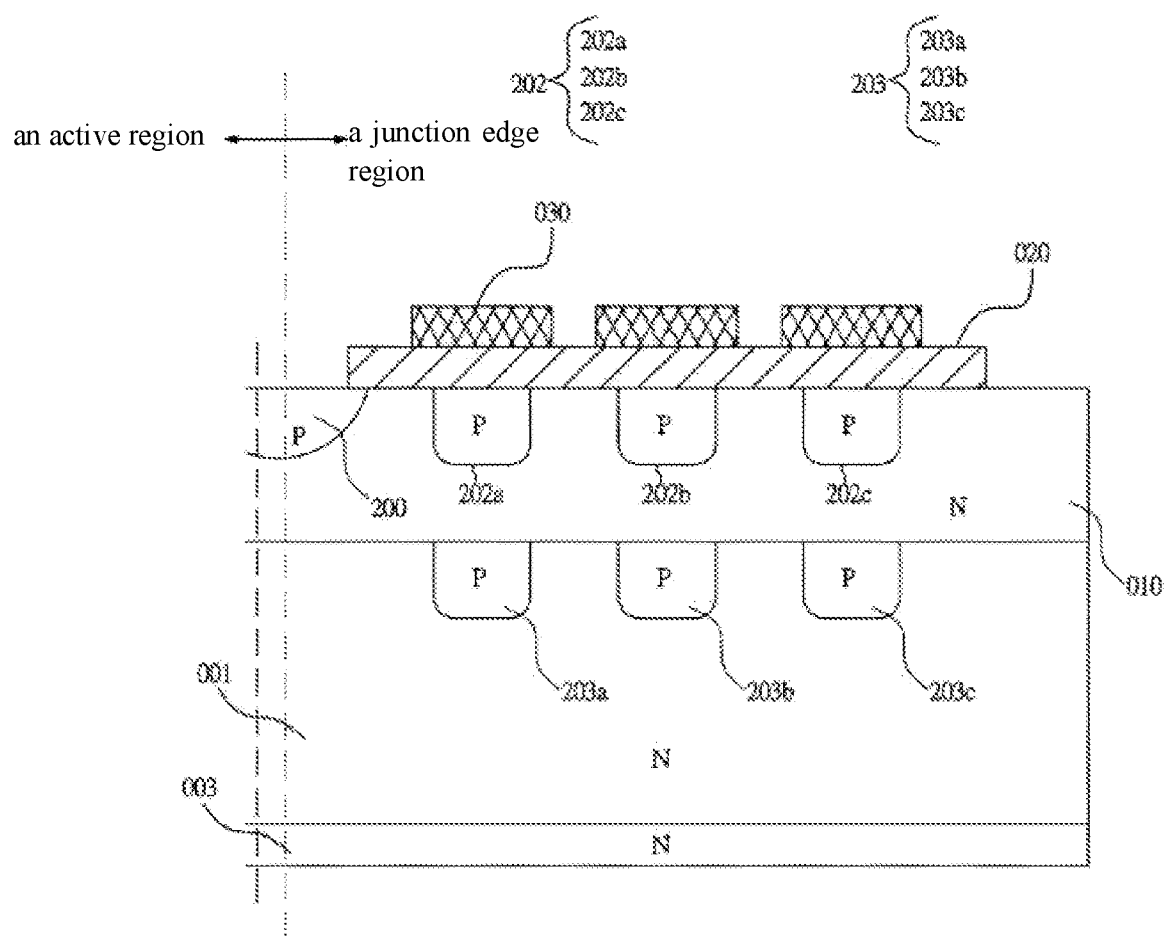
FIG. 14 is a schematic structural diagram of the junction edge termination region including FLRs and field plates of a semiconductor device according to an example of the present application.
Figure 15:
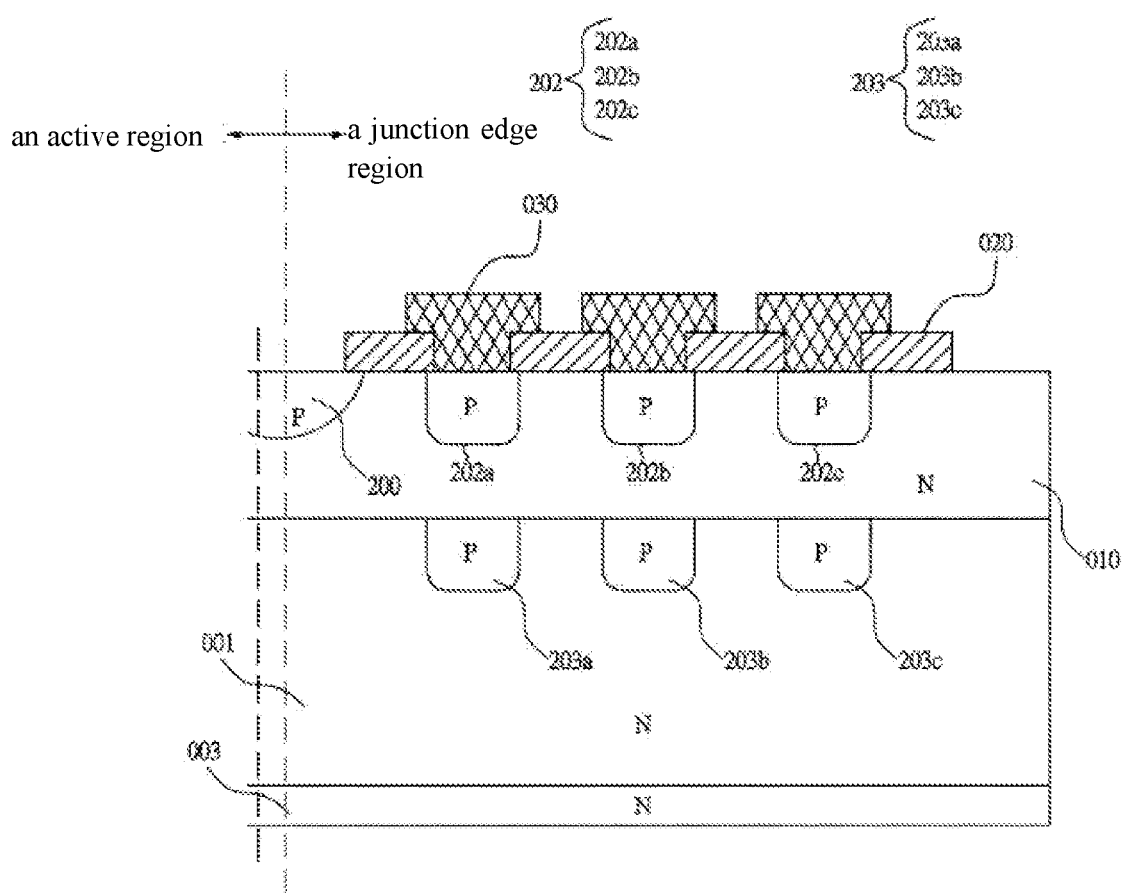
FIG. 15 is a schematic structural diagram of the junction edge termination region including FLRs and field plates of a semiconductor device according to an example of the present application.

FIGS. 14-15 are schematic structural diagrams of the junction edge termination region including FLRs and field plates of a semiconductor device according to an example of the present application. In an example of the present application, field plates 030 are arranged above some or all of the plurality of floating FLRs 202, and the material of the field plates 030 is a conductive medium, including polycrystalline silicon or a metal material with electric conductivity.

As shown in FIG. 14, in some examples, the field plates 030 are isolated from corresponding floating FLRs 202 by the insulator layer 020.

As shown in FIG. 15, in some examples, the insulator layer 020 is provided with contacts at some or all of the floating FLRs 202, and the field plates 030 are in contact with the floating FLRs 202 at corresponding positions through the insulator layer 020.

In some examples, it can be understood from FIGS. 14 and 15 that the number, positions, sizes and coverage of the field plates 030 are designed corresponding to some or all of the floating FLRs 202; in addition, in case that a plurality of field plates 030 are provided, the field plates 030 may be selected to all contact or not contact with the floating FLRs 202, or some field plates 030 contact with the floating FLRs 202 while the other field plates 030 don't contact with the floating FLRs 202, as depends on the functional design of the semiconductor device made by the designer, and is not limited to those examples.

Figure 16:
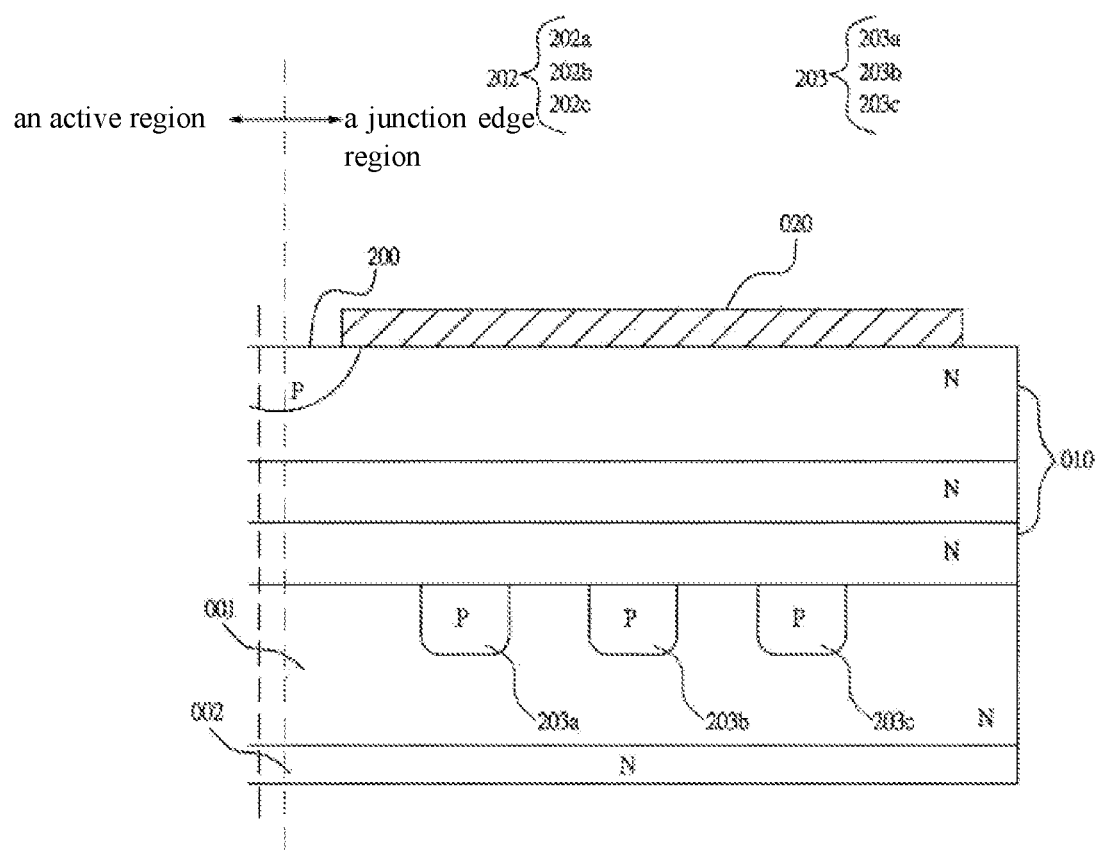
FIG. 16 is a schematic structural diagram of the epitaxial layer of a semiconductor device according to an example of the present application.
Figure 17:
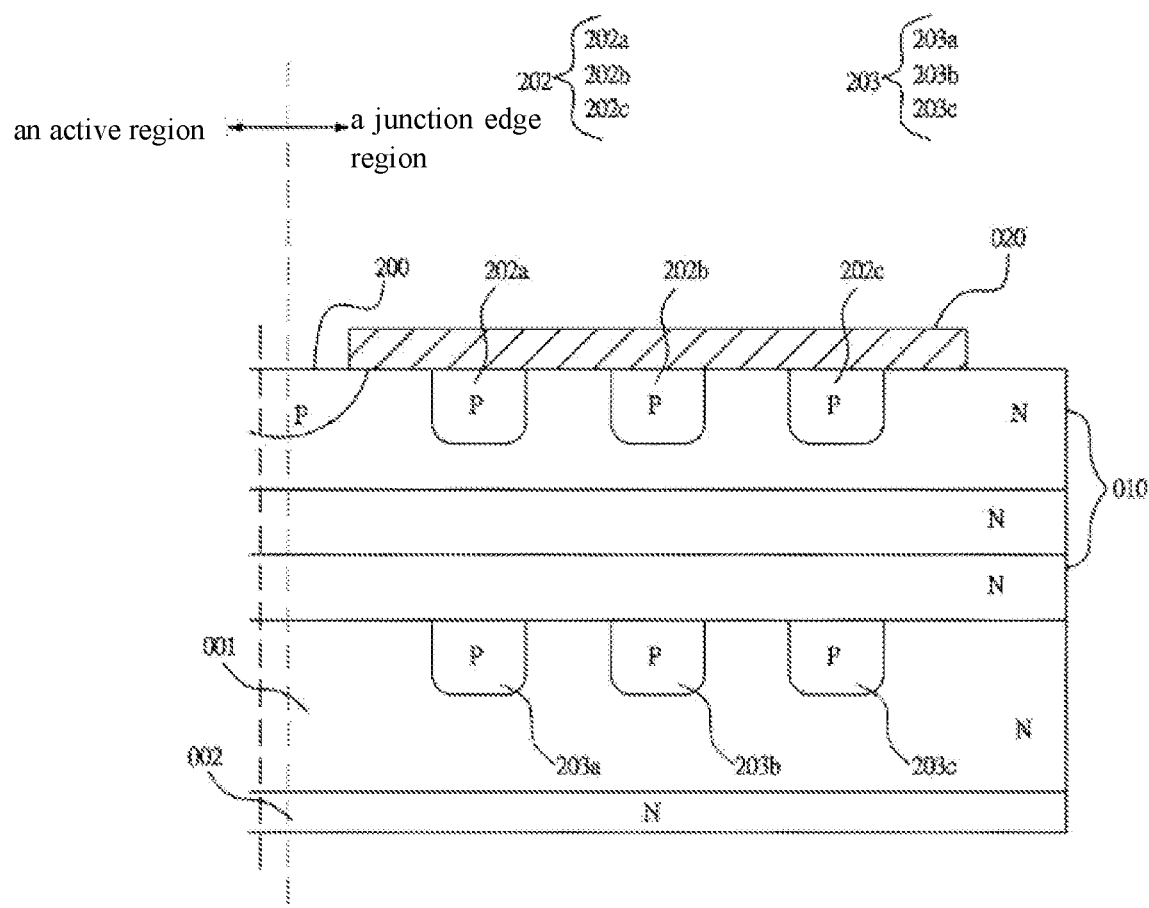
FIG. 17 is a schematic structural diagram of the epitaxial layer of a semiconductor device according to an example of the present application.
Figure 18:
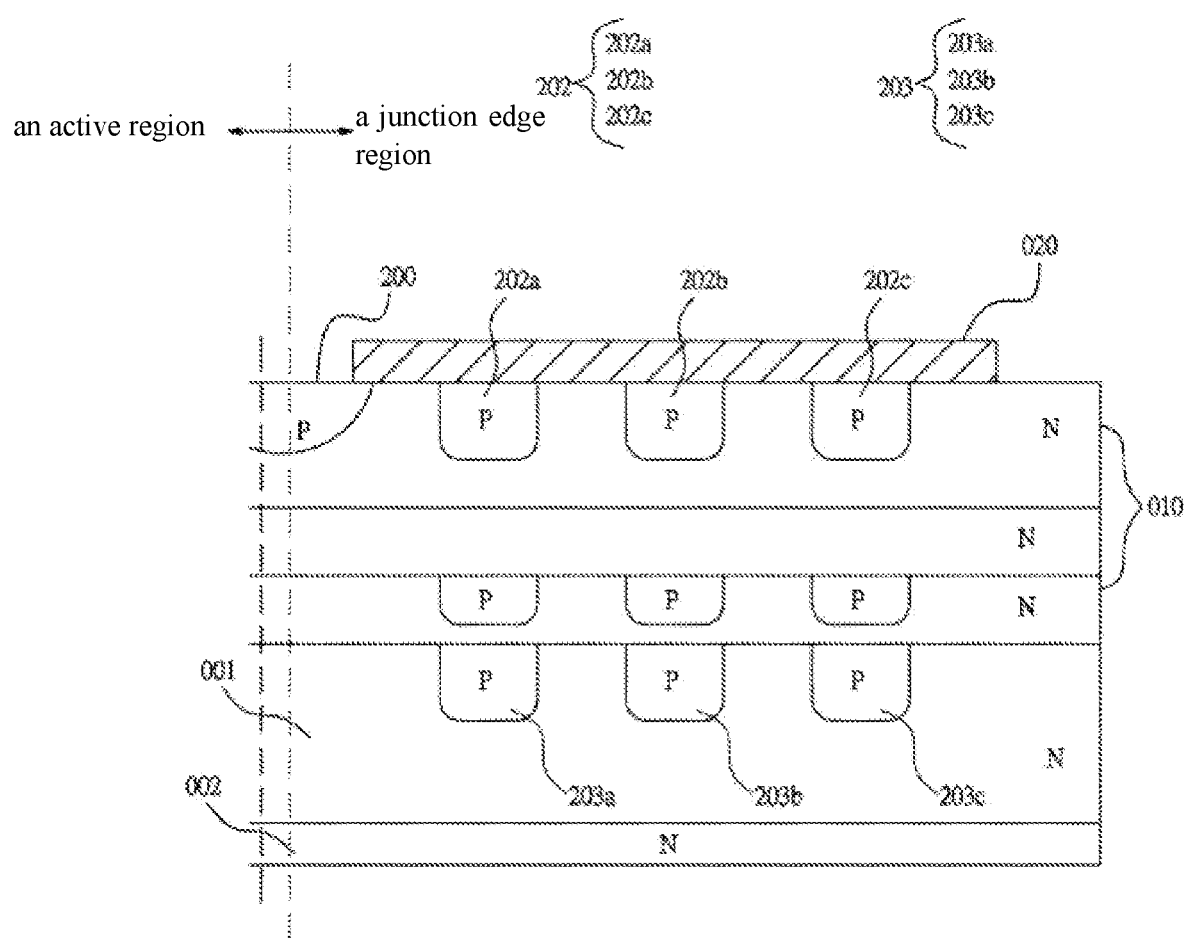
FIG. 18 is a schematic structural diagram of the epitaxial layer of a semiconductor device according to an example of the present application.

FIGS. 16-18 are schematic structural diagram of the epitaxial layer of a semiconductor device according to an example of the present application. In an example of the present application, the epitaxial layer 010 is a hierarchical structure of multiple epitaxies, which can be combined with the previous structures described in preceding examples and illustrated in the drawings. As shown in FIG. 16, floating regions 203 are provided at the place where the semiconductor substrate 001 abuts the bottom layer of the epitaxial layer 010. As shown in FIG. 17, the top layer of the epitaxial layer 010 may be combined with the structure of the floating FLRs 202 and insulator layer 020, and may further be combined with the structure of the field plates 030.

As shown in FIG. 18, in some examples, some or all levels of the epitaxial layer 010 are provided with the plurality of floating regions 203.

In some examples, the semiconductor device further includes a second semiconductor region 003, the conductivity type of which is different from that of the first semiconductor region 002 and which is arranged adjacent to the first semiconductor region 002 in stacked layers, or arranged adjacent to the first semiconductor region 002 on the same layer.

Figure 19:
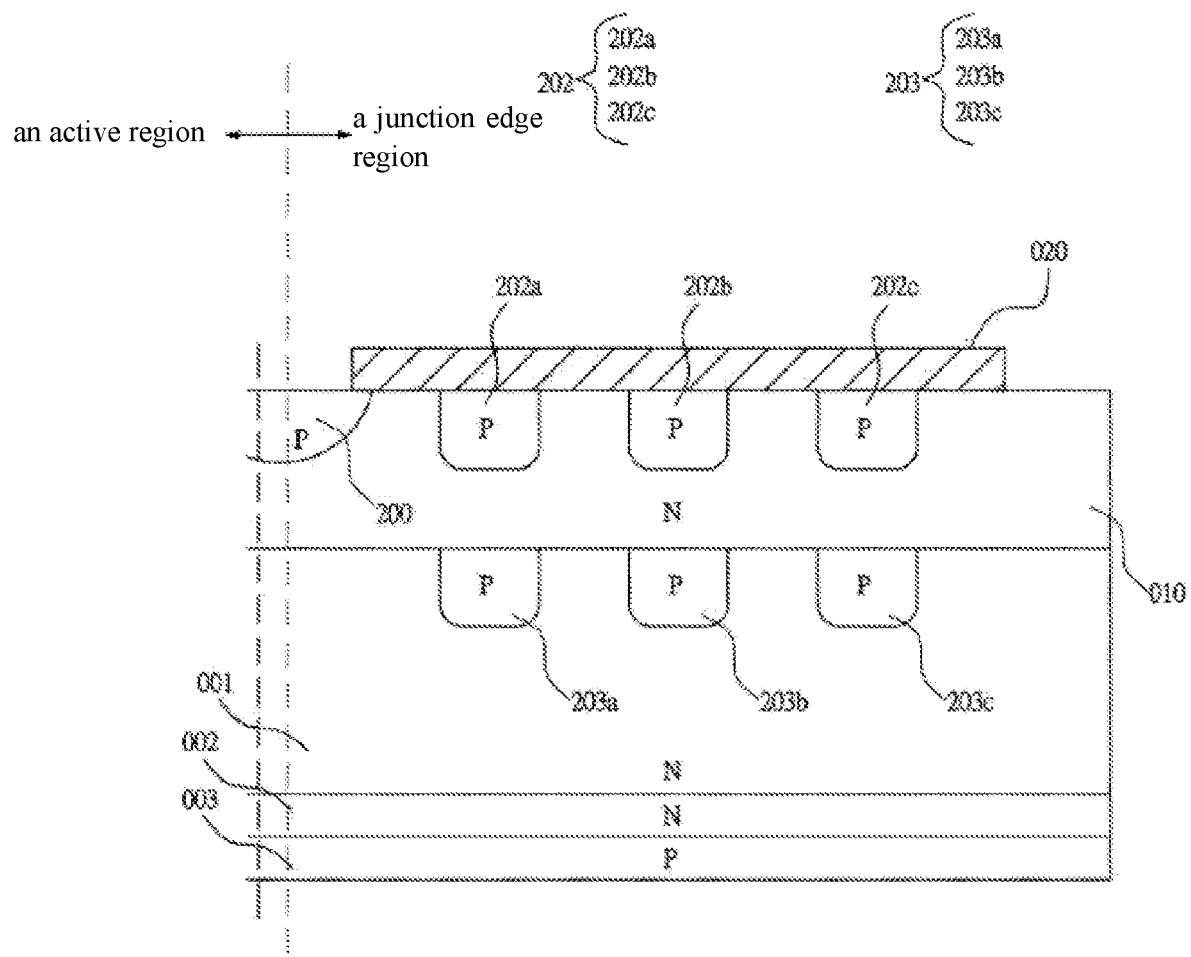
FIG. 19 is a schematic structural diagram of the junction edge termination region of a semiconductor device according to an example of the present application.

FIG. 19 is a schematic structural diagram of the junction edge termination region of a semiconductor device according to an example of the present application. In an example of the present application, a second semiconductor region 003 is arranged at a side of the first semiconductor region 002, and the two semiconductor regions are arranged in stacked layers.

Figure 20:
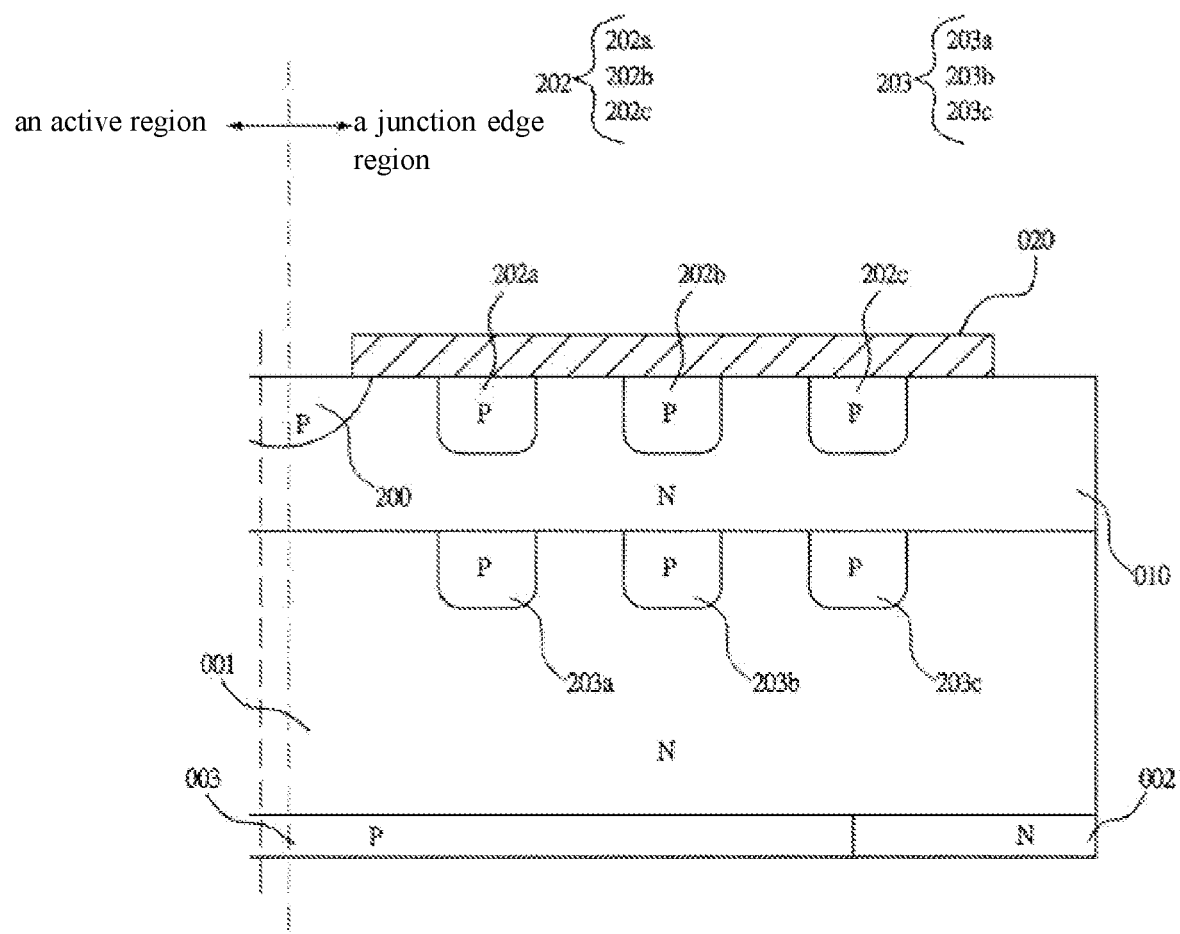
FIG. 20 is a schematic structural diagram of the junction edge termination region of a semiconductor device according to an example of the present application.

FIG. 20 is a schematic structural diagram of the junction edge termination region of a semiconductor device according to an example of the present application. In an example of the present application, a second semiconductor region 003 is arranged at a side edge of the first semiconductor region 002 on the same layer.

Figure 21:
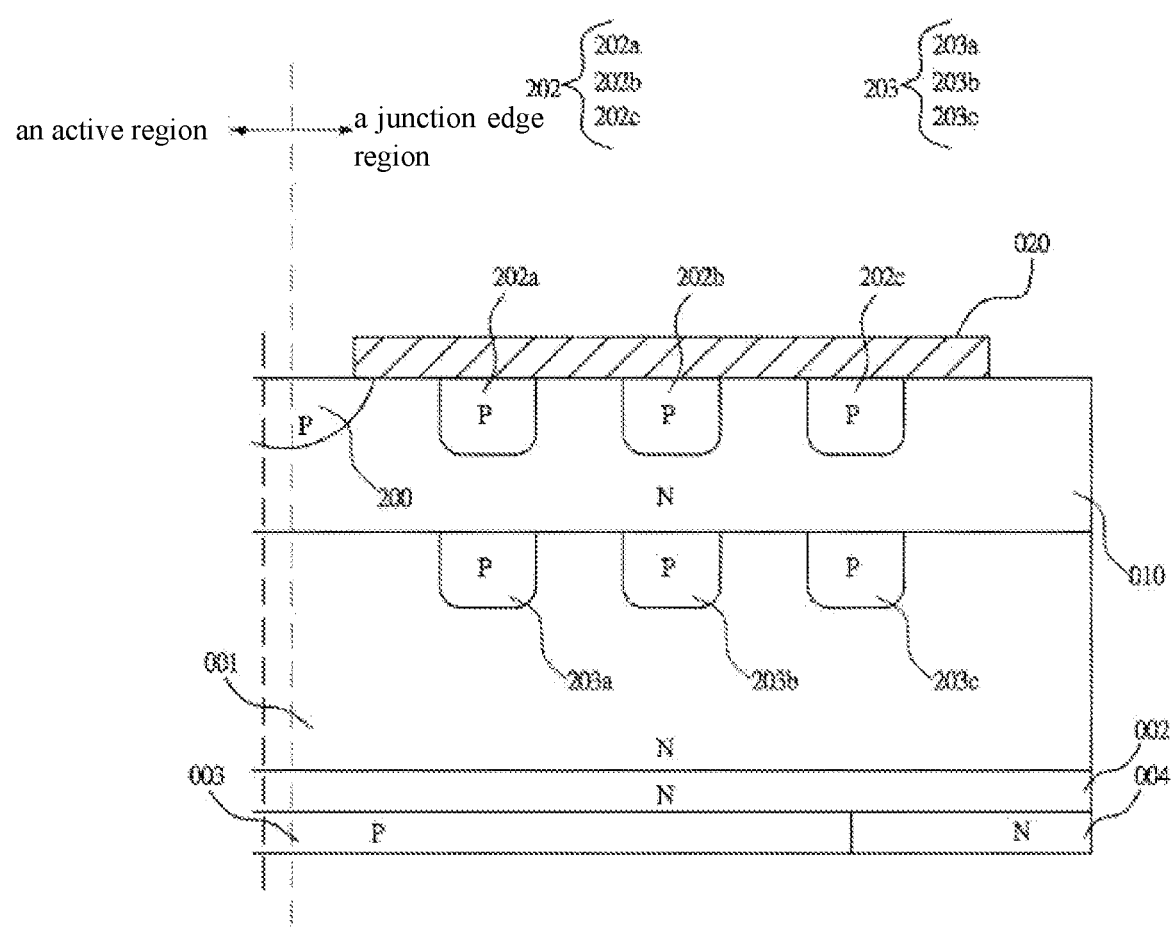
FIG. 21 is a schematic structural diagram of the junction edge termination region of a semiconductor device according to an example of the present application.

FIG. 21 is a schematic structural diagram of the junction edge termination region of a semiconductor device according to an example of the present application. The semiconductor device further comprises a third semiconductor region 004, the conductivity type of the second semiconductor region 003 is different from that of the first semiconductor region 002, and the conductivity type of the third semiconductor region 004 is the same as that of the first semiconductor region 002; the second semiconductor region 003 and the third semiconductor region 004 are adjacently arranged on the same layer, and they are arranged adjacent to and below the first semiconductor region 002 in stacked layers.

In an example of the present application, the materials of the aforementioned semiconductors include silicon (Si) material or silicon carbide (SiC) material.

Another object of the present application is to propose a semiconductor device, which comprises: an active region and a junction edge termination region, wherein the junction edge termination region comprises an N-type semiconductor substrate 001; an N-type epitaxial layer 010 grown on the N-type semiconductor substrate 001, which is a homoepitaxial layer made of the same material as the material of the N-type semiconductor substrate 001 or a heteroepitaxial layer made of a material different from the material of the N-type semiconductor substrate 001; a P-type transition region 200 arranged in a location in the surface of the N-type epitaxial layer 010 adjacent to an active region; an N-type field stop ring 303 which is arranged in the surface of the N-type epitaxial layer 010, and separated from the P-type transition region 200; a plurality of P-type floating regions 203 arranged in the N-type semiconductor substrate 001 and the N-type epitaxial layer 010 at interval; an insulator layer 020 arranged on the surface of the N-type epitaxial layer 010; and an N-type semiconductor region 002 arranged in the bottom surface of the N-type semiconductor substrate 001.

In the present application, floating regions are buried in the semiconductor device, and when the semiconductor device sustains reverse voltage drop, the deeply buried floating regions absorb a part of the electric flux lines emitted from the positively charged ionize donors in the semiconductor substrate, which are supposed absorbed by the negative charged ionize acceptors in the P-type transition region 200, thereby the electric field peak at the main junction in the transition region is decreased. At the same time, since the electric field peak is located inside the semiconductor device and there is no high electric field on the surface, the change of breakdown voltage caused by the change of electric field distribution at the junction edge termination by surface charges is avoided, and decrease of lifetime of the device caused by injection of the hot carriers into the oxidation layer is also avoided. Consequently, the reliability and consistency of the device are improved.

As described above, the first conductivity type is different from the second conductivity type, for example, the first conductivity type is P-type, while the second conductivity type is N-type; alternatively, the first conductivity type is N-type, while the second conductivity type is P-type. In other words, the N-type and P-type in the above description can be interchanged, and the corresponding electrons and holes can also be interchanged, while the principle of the present invention still applies after such interchange.

Expressions such as "in an example of the present application" and "in various examples" are repeatedly used throughout the specification. Such an expression usually doesn't refer to the same example; however, it may also refer to the same example. Terms such as "comprise", "have" and "include", etc. are synonyms, unless otherwise indicated in the context.

Above are just specific examples of the present application and are not intended to limit the present application in any form. While the present application is described above in specific examples, the present application is not limited to those examples. Based on the above technical disclosure, those skilled in the art can make modifications or variations to obtain equivalent examples, without departing from the scope of the technical scheme of the present application. However, any such simple amendment or equivalent variation and modification made to the above examples on the basis of the technical essentials of the present application without departing from the scope of the technical scheme of the present application still fall in the scope of protection of the technical scheme of the present application.

The subject matter of the present application can be manufactured and used in industry and has industrial practicability.

The invention claimed is:

1. A junction edge termination region of a semiconductor device, wherein, said junction edge termination region comprises:
    a semiconductor substrate of a first conductivity type;
        an epitaxial layer of the first conductivity type, adjacently arranged above the semiconductor substrate;
        a transition region of a second conductivity type, arranged in the surface of the epitaxial layer adjacent to an active region;
        a plurality of floating regions of the second conductivity type, arranged at intervals in the semiconductor substrate and the epitaxial layer;
        an insulator layer arranged on the surface of the epitaxial layer;
        a first semiconductor region arranged in the bottom surface of the semiconductor substrate, wherein the first semiconductor region is of the first conductivity type or the second conductivity type; and
        a second semiconductor region and a third semiconductor region, the conductivity type of the second semiconductor region is different from that of the first semiconductor region and the conductivity type of the third semiconductor region is the same as that of the first semiconductor region, the second semiconductor region and the third semiconductor region are adjacently arranged on the same layer, and they are arranged adjacent to and below the first semiconductor region in stacked layers.

2. The junction edge termination region of a semiconductor device according to claim 1, further comprising a plurality of floating field limiting rings (FLRs) arranged in the surface of the epitaxial layer at interval, with some or all of the plurality of floating FLRs being covered by the insulator layer.

3. The junction edge termination region of a semiconductor device according to claim 2, wherein the positions of the plurality of floating regions correspond to the positions of the plurality of floating FLRs in the vertical direction.

4. The junction edge termination region of a semiconductor device according to claim 2, wherein the positions of the plurality of floating regions are staggered from the positions of the plurality of floating FLRs in the vertical direction.

5. The junction edge termination region of a semiconductor device according to claim 2, wherein, with regard to the plurality of floating regions and the plurality of floating FLRs, they correspond to each other at some positions but staggered from each other at other positions in the vertical direction.

6. The junction edge termination region of a semiconductor device according to claim 2, wherein the number of the plurality of floating regions is equal to or different from the number of the plurality of floating FLRs.

7. The junction edge termination region of a semiconductor device according to claim 2, wherein the plurality of floating regions and the plurality of floating FLRs are all connected or partially connected.

8. The junction edge termination region of a semiconductor device according to claim 2, wherein field plates are arranged above some or all of the plurality of floating FLRs, and are isolated from the corresponding floating FLRs by the insulator layer.

9. The junction edge termination region of a semiconductor device according to claim 2, wherein field plates are arranged above some or all of the plurality of floating FLRs, and penetrate through the insulator layer to contact with the floating FLRs at corresponding positions.

10. The junction edge termination region of a semiconductor device according to claim 2, wherein the plurality of floating FLRs is spaced at equal or unequal intervals, the widths of the plurality of floating FLRs are equal to or different from each other.

11. The junction edge termination region of a semiconductor device according to claim 2, wherein the epitaxial layer has a hierarchical structure of multiple epitaxies.

12. The junction edge termination region of a semiconductor device according to claim 11, wherein some or all levels of the epitaxial layer are provided with the plurality of floating regions.

13. The junction edge termination region of a semiconductor device according to claim 1, wherein, the junction edge termination region further comprises a field stop ring of the first conductivity type arranged in the surface of the epitaxial layer, said field stop ring being arranged apart from the transition region.

14. The junction edge termination region of a semiconductor device according to claim 1, wherein the plurality of floating regions is spaced at equal or unequal intervals, the widths of the plurality of floating regions are equal to or different from each other.

15. The junction edge termination region of a semiconductor device according to claim 1, wherein the first conductivity type is N-type, and the second conductivity type is P-type; or, the first conductivity type is P-type, and the second conductivity type is N-type.

16. The junction edge termination region of a semiconductor device according to claim 1, wherein the concentration of the semiconductor substrate is equal to or different from that of the epitaxial layer.

* * * * *